United States Patent [19]

Shimada

[11] 4,393,480
[45] Jul. 12, 1983

[54] ADDRESS BUFFER CIRCUIT

[75] Inventor: Hiroshi Shimada, Tokyo, Japan

[73] Assignee: Fujitsu Limited, Kawasaki, Japan

[21] Appl. No.: 234,197

[22] Filed: Feb. 13, 1981

[30]  Foreign Application Priority Data

Feb. 16, 1980 [JP]  Japan .................................. 55-18018

[51] Int. Cl.³ .............................................. G11C 11/40
[52] U.S. Cl. .................................... 365/227; 365/230;
365/174; 307/238.3
[58] Field of Search ............... 365/174, 189, 226, 227,
365/228, 229, 230; 307/238.3

[56]  References Cited

U.S. PATENT DOCUMENTS 4,272,834  6/1981  Noguchi et al. ................. 365/174 X Primary Examiner—Joseph A. Popek
Attorney, Agent, or Firm—Staas & Halsey

[57]  ABSTRACT

An address buffer circuit which generates a pair of complementary signals for selecting a memory cell according to an address input signal is disclosed. This address buffer circuit comprises a short circuit device connected between a pair of output terminals for the complementary signals. During the stand-by period of a memory, the short circuit device electrically connects the pair of output terminals, so that the potential of both of the pair of output terminals becomes an intermediate level between high and low levels provided at the output terminals during the active period of the memory.

13 Claims, 4 Drawing Figures

ADDRESS BUFFER CIRCUIT

BACKGROUND OF THE INVENTION

1. Field of the Invention

This invention relates to a power down type address buffer circuit which suspends power consumption during a stand-by period.

2. Description of the Prior Art

Generally, in a RAM (Random Access Memory) where memory cells are arranged in the form of a matrix, a memory cell is selected in accordance with outputs of row and column address decoders. These address decoders are generally composed of NOR gates and applied to the NOR gates are specified signals from among the in-phase internal address signals and inverse-phase internal address signals generated from an external address input in address buffer circuits. Recently, in view of efforts towards reducing power consumption, the address buffer circuit is often so designed that the power consumption of the circuits is suspended during the stand-by period by means of a signal generated from an external chip select input signal. In such a power-down type address buffer circuit, the output timing differs according to the relation between an external chip select input signal and an external address input signal. This difference is generally a very short period and it is not a problem when the chip select access is faster than the address access, but when the chip select access becomes slower than the address access because of the circuit design, the difference causes a slower the access time for the memory.

SUMMARY OF THE INVENTION

It is an object of this invention to offer an address buffer circuit which solves the above-mentioned disadvantages and assures high speed operation.

It is another object of this invention to offer an address buffer circuit having a simple structure.

Such an address buffer circuit is constructed so that the power consumption in the circuit is suspended by an external signal applied during the stand-by period and so that it outputs a par of complementary outputs corresponding to an address input signal. The address buffer circuit of the present invention which attains the above-mentioned purposes includes a short circuit device which becomes ON during said stand-by period and is connected between the complementary output terminals in the output stage. The level of said complementary output terminals during said stand-by period is selected at an intermediate level between the high and low levels generated during the active period.

DESCRIPTION OF THE PREFERRED EMBODIMENT

Figure 1:
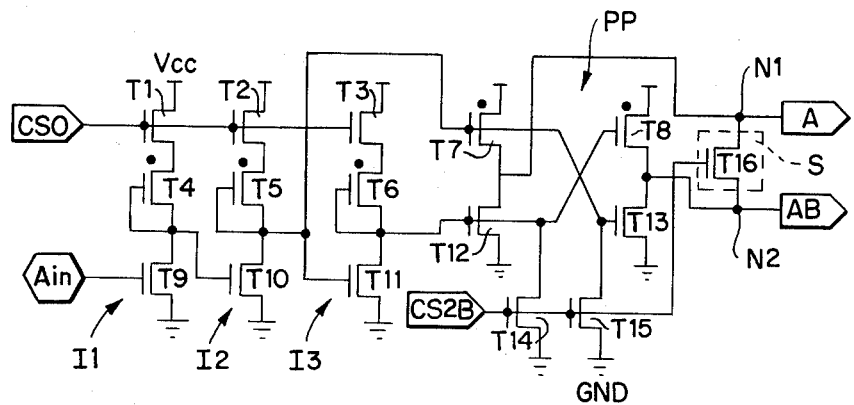
FIG. 1 shows an embodiment of the address buffer circuit of the present invention.

FIG. 1 shows an embodiment of the power-down type address buffer circuit of the present invention and the circuit excluding the short circuit device S corresponds to the conventional structure.

In FIG. 1, the depletion type MOS transistors $T_4$ to $T_6$ and the enhancement type MOS transistors $T_9$ to $T_{11}$ form the three stages of invertors $I_1$ to $I_3$ while the depletion type MOS transistors $T_7$ and $T_8$ and the enhancement type MOS transistors $T_{12}$ and $T_{13}$ form the push-pull circuit PP of the output stage. The invertors $I_1$ to $I_3$ comprising three stages sequentially invert an external address input $A_{in}$ stage by stage. An output of the 2nd stage invertor $I_2$ is applied to the respective gates of transistors $T_7$ and $T_{13}$ of the push-pull circuit PP, while an output of the 3rd stage invertor $I_3$ to the gates of transistors $T_{12}$ and $T_8$ of the circuit PP. Thereby, the internal address signal A which is in-phase with the external address input $A_{in}$ and the internal address signal AB which has inverse phase to the signal $A_{in}$ can be obtained at the complementary output terminals $N_1$ and $N_2$ of the push-pull circuit PP. The transistors $T_1$ to $T_3$ connected between the invertors $I_1$ to $I_3$ and the power source Vcc are power-down transistors. These transistors are OFF during the standby period because the internal chip select signal CSO is inverted in phase to the external chip select signal and is "L" level during the standby period, thus disconnecting the power supply route for the invertors $I_1$ to $I_3$. In addition, the transistors $T_{14}$ and $T_{15}$ connected between the gates of transistors of push-pull circuit PP and the ground potential GND are also power-down transistors. These transistors turn ON when the internal chip select signal CS2B which is in-phase with the external chip select signal becomes "H" level during the standby period, thus forcibly pulling the gates of transistors $T_7$, $T_8$, $T_{12}$ and $T_{13}$ to the ground potential.

Figure 2:
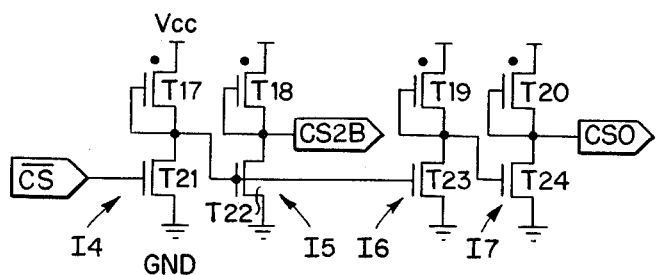
FIG. 2 shows a circuit for generating an internal chip select signal.

FIG. 2 shows the circuit for generating an internal chip select signal CSO and CS2B. $T_{17}$ to $T_{20}$ are depletion type load MOS transistors, while $T_{21}$ to $T_{24}$ are enhancement type drive transistors. These transistors form two stages of invertors $I_4$ and $I_5$ and three stages of invertors $I_4$, $I_6$ and $I_7$. When an external input $\overline{CS}$ is applied to the invertor $I_4$ of the first stage, the signal CS2B which is in-phase with the external input is obtained from the 2nd stage invertor $I_5$, and the signal CSO which has inverse phase to the external input is obtained through the invertors $I_4$, $I_6$ and $I_7$ of the 1st, 2nd and 3rd stages. This means that the internal chip select signal CSO and the signal CS2B are delayed a little from the external chip select input $\overline{CS}$ signal. Therefore, the following phenomenon occurs in the circuit of FIG. 1, excluding the short circuit device S.

Namely, the external chip select input signal $\overline{CS}$ for the circuit shown in FIG. 2 is different in the levels for the stand-by period STB and active period ACT as shown in FIG. 3A, but the complementary outputs A and AB of the push-pull circuit PP both change in a different manner as shown in FIGS. 3C and 3E when the external address input $A_{in}$ to the circuit of FIG. 1 changes in a different manner as shown in FIGS. 3B and 3D. FIG. 3B shows the change of the external address input $A_{in}$ at the timing where the external chip select input $\overline{CS}$ enters the stand-by mode. As explained above, since the address buffer circuit of FIG. 1 is operated by the internal signals CSO and CS2B which are delayed a little from the external input signal $\overline{CS}$, these internal signals CSO and CS2B are still at the level of the active condition (CSO is "H", while CS2B is "L") when the external signal $\overline{CS}$ becomes "H" and thus the address buffer circuit continues the operation until the internal signals CSO and CS2B become the stand-by level. Thereafter, when the internal signal CS2B becomes the "H" level, the gates of transistors of the push-pull circuit PP are all pulled to the ground potential, As a result, the enhancement type transistors $T_{12}$ and $T_{13}$ become OFF, while the depletion type transistors $T_7$ and $T_8$ also become OFF, the outputs A and AB of the complementary output terminals $N_1$ and $N_2$ fall, in the case of FIG. 3B, to the intermediate levels $L_1$ and $L_2$ ($L_1 \approx L_2$) which are determined by the threshold level of the transistors $T_7$ and $T_8$ as shown in FIG. 3C. Namely, if the gate and source are electrically connected, the depletion type transistors $T_7$ and $T_8$ can provide the output at a level that is almost as high as the power source voltage Vcc, but when the gate potential is equal to the ground potential GND as in the present case, these transistors $T_7$ and $T_8$ cannot provide such a high output level but a level as indicated in FIG. 3C. Thereafter, the levels of the internal address outputs A and AB begin changing from the just preceding levels $L_1$ and $L_2$ in the succeeding active period ACT. In other words, the signal A falls to the ground potential GND from the level $L_1$, while the inverted signal AB increases up to Vcc from the level $L_2$. In contrast, since the external address input $A_{in}$ is locked in the case of FIG. 3D even in the stand-by period STB, when the signal CS2B becomes the "H" level and the gates of transistors of push-pull circuit PP are pulled to the ground potential, the inverted signal AB increases up to a level $L_2$ determined by the threshold level of the depletion type transistor $T_3$ as in the case of FIG. 3C. However, the signal A maintains the level $L_3$ which is almost equal to Vcc as in the case of FIG. 3E since the charges of terminal $N_1$ are held because the transistor $T_{12}$ is in the OFF state and there is no discharge route. This level $L_3$ is gradually lowered by the junction leak etc. but such variation cannot always be expected in a case where a transistor operates within a short cycle. Therefore, in the next active period ACT, the change of output level starts from these levels of $L_2$ and $L_3$ and the inverted signal AB increases up to the power source voltage Vcc from the level $L_2$ as in the case of FIG. 3C. But the signal A decreases to the ground potential GND from the level $L_3$ (=Vcc). Thereby, a time difference $T_0$ is generated in the change of output in the cases of FIG. 3C and FIG. 3E.

The input stage of the address decoder (not illustrated) is composed of a NOR gate which receives plural in-phase and inverted address signals as the input and its operation speed is determined by the change of inputs between the "H" and "L" levels. Therefore, on the occasion of selecting row or column, the time difference corresponding to $T_0$ is generated for the operation as indicated in FIG. 3B. This time difference $T_0$ is a very short period and it does not become a problem as mentioned above when the chip select access is faster than the address access. However, if the chip select access becomes slower than the address access due to the circuit design, the access to the memory is delayed as long as the time difference $T_0$ explained above.

Figure 3:
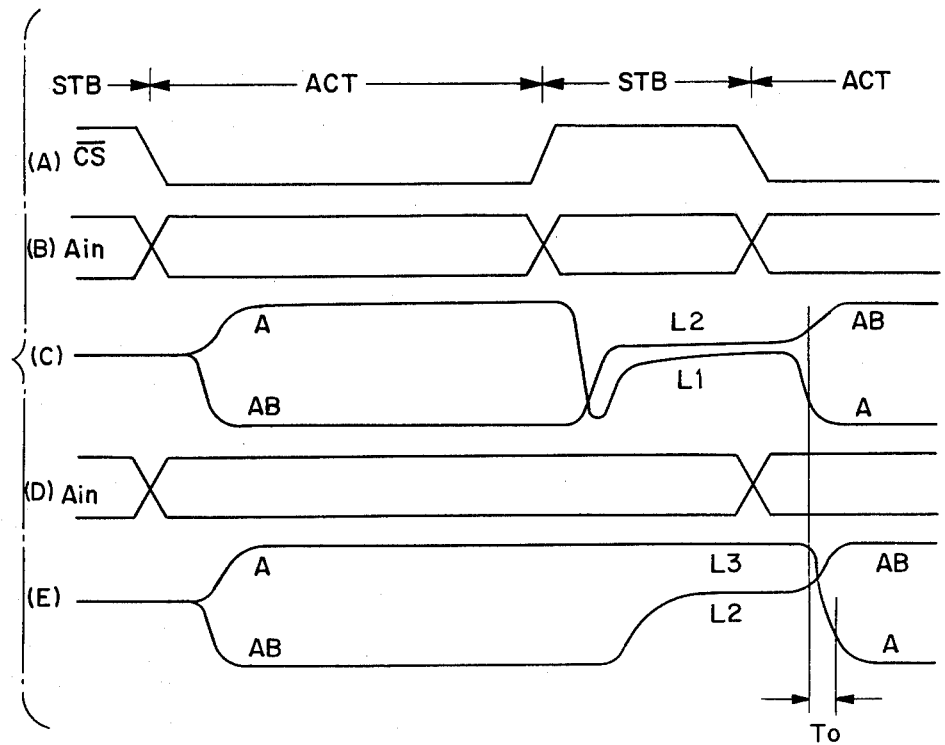
FIG. 3 shows signals at respective points of the conventional address buffer circuit.
Figure 4:
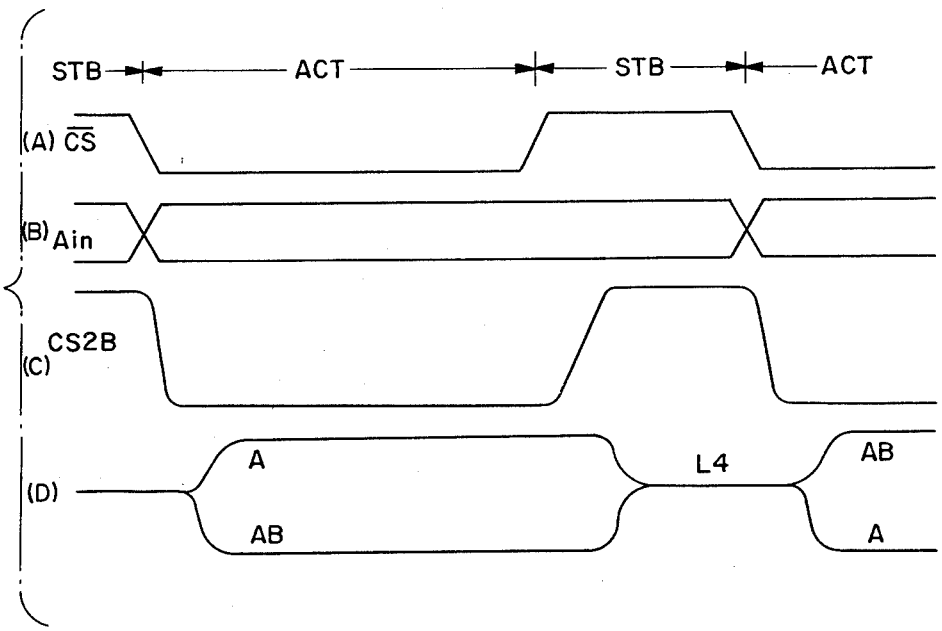
FIG. 4 shows signals at respective points of the address buffer circuit of the present invention.

In the present invention, in view of improving such disadvantages, the short circuit device comprising the enhancement type MOS transistor $T_{16}$ is connected as shown in FIG. 1 between the complementary output terminals $N_1$ and $N_2$ of the push-pull circuit PP at the output stage of the address buffer circuit, and this short circuit device is controlled by the internal chip select signal CS2B which is in-phase with the external chip select signal. For this reason, the transistor $T_{16}$ becomes OFF in the active period ACT and perfectly isolates the complementary output terminals $N_1$ and $N_2$ having no influence on the outputs A and AB but becomes ON in the stand-by period STB, electrically connecting the terminals $N_1$ and $N_2$. FIG. 4 shows the operating waveforms of FIG. 1 where the transistor $T_{16}$ is provided, corresponding to FIGS. 4A and 4B and FIGS. 3A and 3B. If the transistor $T_{16}$ is not provided under this condition, the outputs A and AB change as indicated in FIG. 3E as mentioned previously, but when the transistor $T_{16}$ which becomes ON in the stand-by period STB, the terminals $N_1$ and $N_2$ are electrically connected and the signals A and AB are pulled to the same intermediate level $L_4$. In regard to a voltage drop of the transistor $T_{16}$, this transistor perfectly becomes ON when the gate voltage $V_G$ of said transistor (here, CS2B=Vcc) is sufficiently higher than the drain voltage $V_D$ (here, the potential A at the point $N_1$), thus resulting in no voltage drop as high as $V_{th}$. This condition is not satisfied since $V_G$ becomes equal to $V_D$ in the initial condition where the transistor $T_{16}$ becomes ON, but since $V_G$ becomes higher than $V_D$ as the charges discharge from the point $N_1$ to the point when A is "H" and AB is "L" level, the points $N_1$ and $N_2$ are finally terminated by the transistor $T_{16}$ without resulting in the voltage drop as high as $V_{th}$. Therefore, both levels of A and AB become the same intermediate level $L_4$ in the stand-by period STB. Since this level $L_4$ is almost equal to the level $L_2$ indicated in FIG. 3, the levels of A and AB change as shown in FIG. 3C when they shift to the next active period ACT. Namely, a time difference corresponding to $T_0$ shown in FIG. 3 is not generated.

As explained previously, according to the present invention, since a high speed change of output of the power down type address buffer circuit can be realized with a simple structure a delay of access time for the memory device can be much improved.

What is claimed is:

1. An address buffer circuit, having an active period which has high and low levels and having a standby period, which generates a pair of complementary output signals corresponding to an address input signal, comprising:

buffer circuit means for buffering the address input signal;

means, operatively connected to said buffer circuit means, for suspending power consumption by said address buffer circuit when in the stand-by period responsive to an external signal;

output means, operatively connected to said buffer circuit means, having a par of output terminals for outputting said pair of complementary output signals; and short circuit means, operatively connected between said pair of output terminals of said output means, for forcing the potential of said pair of output terminals to a same potential between the high and low levels of said address buffer circuit in the active period by electrically connecting said pair of output terminals in said stand-by period.

2. An address buffer circuit as claimed in claim 1, wherein said external signal comprises a chip select signal.

3. An address buffer circuit as claimed in claim 1, wherein said output means comprises a push-pull circuit operatively connected to said address buffer circuit and said short circuit means.

4. An address buffer circuit as claimed in claim 1, wherein said short circuit means comprises a MOS transistor operatively connected between said pair of output terminals of said output means.

5. An address buffer circuit as claimed in claim 4, wherein said MOS transistor is operatively connected to receive and is controlled by the external signal.

6. An address buffer circuit, operatively connectable to receive an external address signal and an external chip select signal and having a stand-by period, comprising:
   address and buffer means, operatively connectable to receive the external address signal and the external chip select signal, for generating first and second internal address signals at first and second output terminals, respectively, responsive to the external address signal and the external chip select signal; and
   short circuit means, operatively connected between the first and second output terminals of said address and buffer means and operatively connectable to receive the external chip select signal, for connecting the first and second output terminals together responsive to the external chip select signal, so that the first and second output terminals are held at the same level, the first and second internal address signals are at the same level and power consumption by said address buffer circuit is suspended when in the stand-by period.

7. An address buffer circuit as claimed in claim 6, wherein said short circuit means comprises a transistor operatively connected between the first and second output terminals.

8. An address buffer circuit as claimed in claim 7, wherein said transistor is a MOS transistor.

9. An address buffer circuit as claimed in claim 6, wherein said address and buffer means comprises:
   first means, operatively connected to said short circuit means and operatively connectable to receive the external chip select signal, for generating first and second internal chip select signals responsive to the external chip select signal;
   second means, operatively connected to said first means and operatively connectable to receive the external address signal, for generating first and second internal signals responsive to the external address signal and the first internal chip select signal; and
   a push-pull circuit, operatively connected to said first means, said second means and said short circuit means, for generating the first and second internal address signals responsive to the first and second internal signals and the second internal chip select signal.

10. An address buffer circuit as claimed in claim 9, wherein said first means comprises:
    a first inverter operatively connectable to receive the external chip select signal;
    a second inverter, operatively connected to said first inverter and said push-pull circuit, for generating the second internal chip select signal;
    a third inverter operatively connected to said second inverter; and
    a fourth inverter, operatively connected to said third inverter and said second means, for generating the first internal chip select signal.

11. An address buffer circuit as claimed in claim 9, wherein said second means comprises:
    a first inverter operatively connectable to receive the external address signal;
    a second inverter, operatively connected to said first inverter and said push-pull circuit, for generating the first internal signal;
    a third inverter, operatively connected to said second inverter and said push-pull circuit, for generating the second internal signal; and
    first through third power down transistors, operatively connected to said first means and said first through third inverters, respectively, for cutting off power supplied to said first through third inverters responsive to the first internal chip select signal.

12. An address buffer circuit as claimed in claim 9, wherein said address buffer circuit further comprises first and second power down transistors, operatively connected to said first means and said push-pull circuit, for cutting off power supplied to said push-pull circuit responsive to the second internal chip select signal.

13. An address buffer circuit operatively connectable to receive an external chip select signal, comprising:
    address means for generating first and second internal address signals, said address means comprising:
      a push-pull circuit producing outputs; and
      a power down transistor operatively connected to said push-pull circuit, operatively connectable to receive the external chip select signal and being controlled by the external chip select signal; and
    short circuit means, operatively connected to said push-pull circuit and operatively connectable to receive the external chip select signal, for forcing the outputs of said push-pull circuit to a same potential level and being controlled by the external chip select signal.

* * * * *

UNITED STATES PATENT AND TRADEMARK OFFICE
CERTIFICATE OF CORRECTION

PATENT NO. : 4,393,480
DATED : July 12, 1983
INVENTOR(S) : Hiroshi Shimada

It is certified that error appears in the above-identified patent and that said Letters Patent is hereby corrected as shown below:

Column 1, line 20, delete "view of";

line 32, "the access" should be --access--.

Column 2, line 35, delete "an";

line 36, "signal" should be --signals--.

Column 4, line 24, after "point", insert --$N_2$--;

line 37, after "structure", insert --and--;

line 52, "par" should be --pair--.

Signed and Sealed this

Seventh Day of February 1984

[SEAL]

Attest:

GERALD J. MOSSINGHOFF

Attesting Officer  Commissioner of Patents and Trademarks